United States Patent [19]

English

[11] Patent Number: 4,938,702
[45] Date of Patent: Jul. 3, 1990

[54] CONNECTOR CLAMP FOR ATTACHING FLAT ELECTRICAL CONDUCTOR LEADS TO PRINTED WIRING BOARDS

[75] Inventor: George P. English, Hayden Lake, Id.

[73] Assignee: Key Tronic Corporation, Spokane, Wash.

[21] Appl. No.: 410,911

[22] Filed: Sep. 22, 1989

[51] Int. Cl.⁵ ............................................... H01R 9/09
[52] U.S. Cl. ........................................ 439/67; 439/77; 439/329; 439/493; 439/835; 439/844
[58] Field of Search ............... 439/67, 77, 492, 493, 439/329, 828, 834, 835, 844

[56] References Cited

U.S. PATENT DOCUMENTS

| | | | |
|---|---|---|---|
| 3,492,538 | 1/1970 | Fergusson | 439/67 |
| 4,019,798 | 4/1977 | Fielinski | 439/67 |
| 4,111,510 | 9/1978 | Zurcher | 439/67 |
| 4,824,391 | 4/1989 | Ti | 439/67 |
| 4,846,709 | 7/1989 | Kobayashi et al. | 439/67 |

Primary Examiner—P. Austin Bradley
Attorney, Agent, or Firm—Wells, St. John & Roberts

[57] ABSTRACT

A connector clamp for attaching conductive surface pads on a flexible sheet to a printed wiring board having complementary conductive surface pads is bent from an elongated precut pattern. The resulting clamp member includes a series of transverse fingers along one leg of a U-shaped cross-sectional configuration. The fingers are opposed by a continuous leg joined to them by a continuous central base that completes the U-shaped cross-sectional configuration. The internal width across the central base exceeds the combined thickness of the sheet and board secured by the clamp. It exerts clamping force along a line extending across both clamp legs to assure both mechanical and electrical connection between the joined elements.

3 Claims, 4 Drawing Sheets

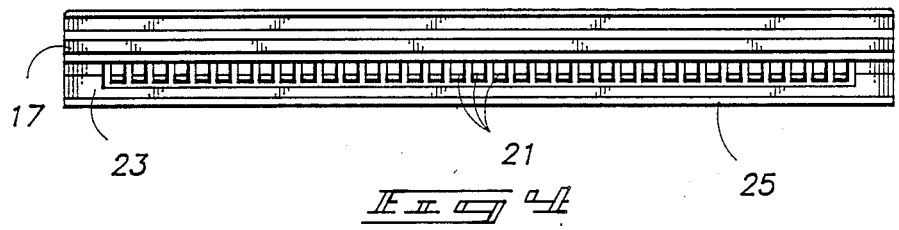
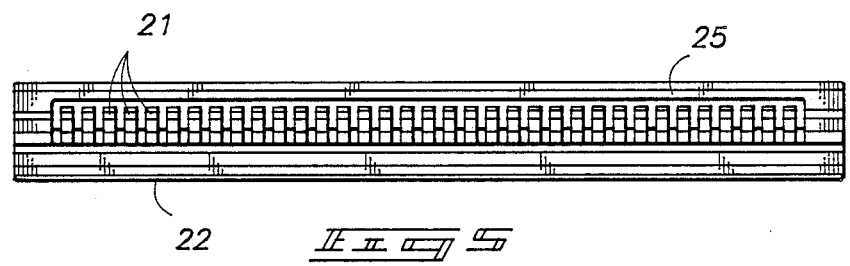
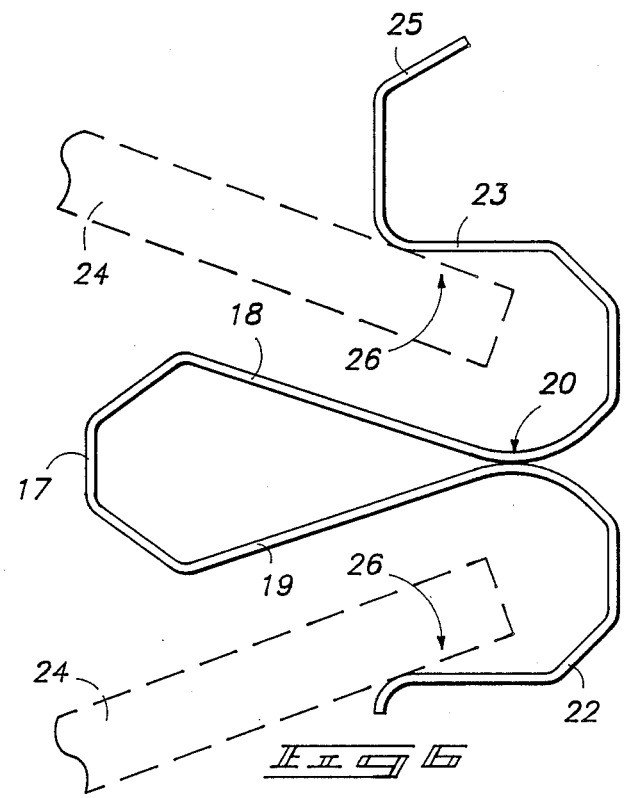

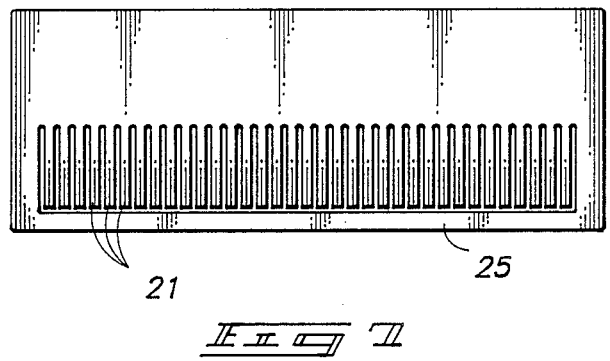
_FIG. 7_
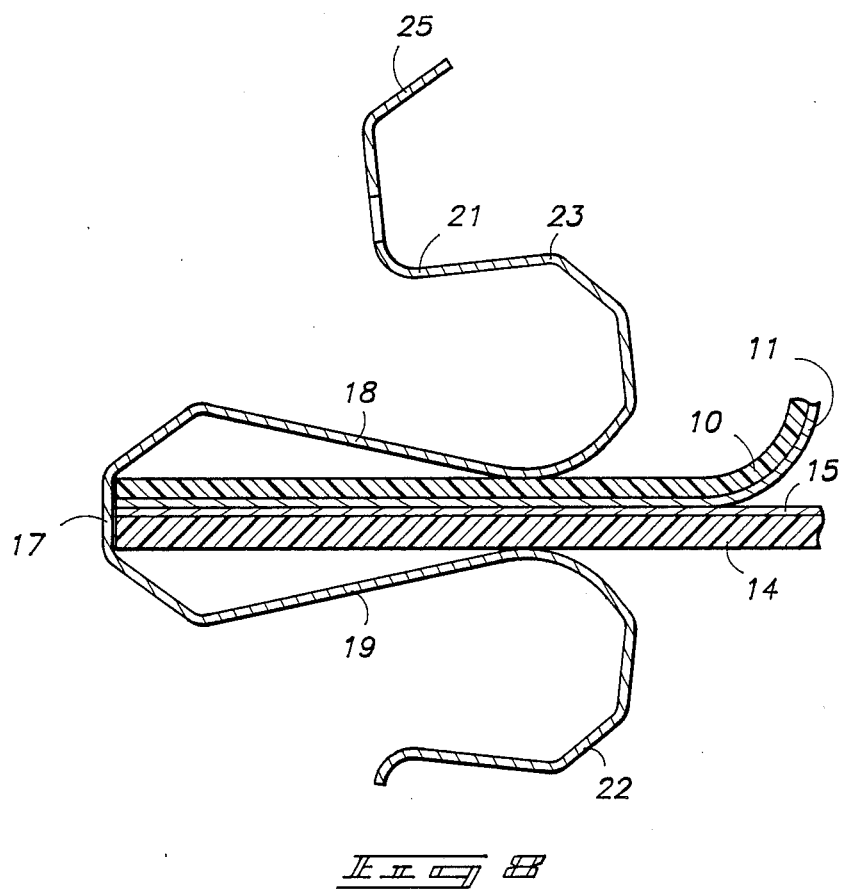
_FIG. 8_

CONNECTOR CLAMP FOR ATTACHING FLAT ELECTRICAL CONDUCTOR LEADS TO PRINTED WIRING BOARDS

TECHNICAL FIELD

This disclosure relates to connector clamps for effecting mechanical and electrical connections between electrical leads on a flexible sheet and a printed wiring board.

BACKGROUND OF THE INVENTION

In many electronic environments, it is necessary to connect electrical leads printed on thin flexible sheets of insulating material to related electrical leads on printed wiring boards. The present invention arose from a desire to simplify such connections with respect to the construction and fabrication of computer keyboards. Such keyboards often include membrane switching assemblies associated with manually depressible keytops. The electrical leads from the thin flexible membrane switch assembly must be connected to a printed wiring board containing control electronic devices associated with the keyboard. The electrical leads are carried to the circuit board by a "tail" comprising a sheet of flexible insulating material having traces printed on one side that lead to conductive surface pads across one of its edges. The pads on the tail must securely engage a printed wiring board having traces that lead to complementary conductive surface pads along one of its edges.

Conventional connectors for printed wiring boards are both bulky and relatively expensive. They require a number of fabrication steps to mount them on a printed wiring board and attach to the flexible membrane and switch. The present connector clamp, installable in a single step and presented as a unitary product, replaces as many as 34 parts in a typical connector as presently used in this industry. By reducing the number of parts requiring fabrication and control, higher reliability in the desired electrical connections can be assured.

BRIEF DESCRIPTION OF THE DRAWINGS

The preferred embodiment of the invention is illustrated in the accompanying drawings, in which:

FIG. 4 is an edge view as seen from the top of FIG. 2;

FIG. 5 is an edge view as seen from the bottom of FIG. 2;

FIG. 6 is an enlarged end view;

FIG. 7 is a pattern of the sheet from which the connector clamp is bent;

FIG. 8 is an enlarged sectional view taken along line 8—8 in FIG. 1;

DETAILED DESCRIPTION OF THE PREFERRED EMBODIMENT

The following disclosure of the invention is submitted in compliance with the constitutional purpose of the Patent Laws "to promote the progress of science and useful arts" (Article 1, Section 8).

Figure 1:
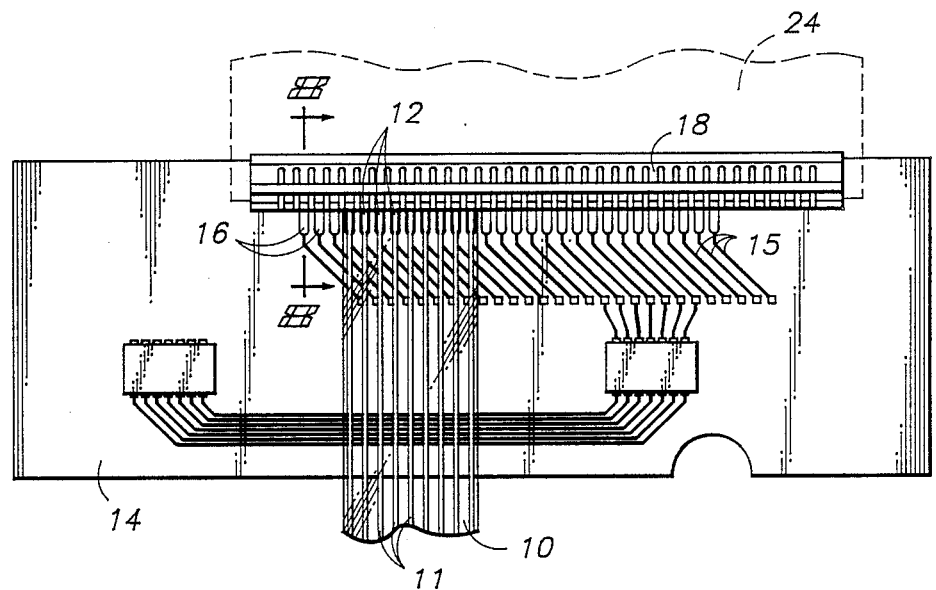
FIG. 1 is a plan view of the installed connector clamp.
Figure 2:
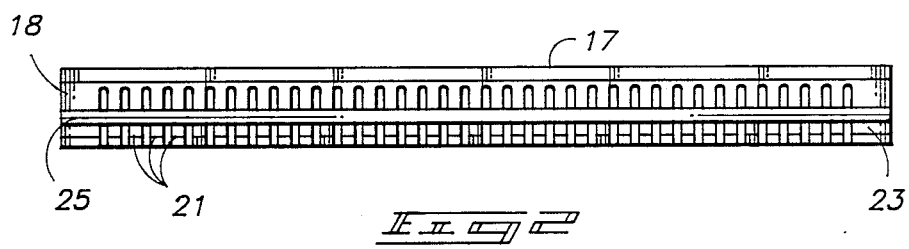
FIG. 2 is an enlarged plan view of the connector clamp.

As seen in FIGS. 1 and 8, the present invention is designed to connect a flexible sheet 10 having conductive traces 11 that lead to conductive surface pads 12 arranged across one of its edges to a printed wiring board 14 having traces 15 leading to complementary conductive surface pads 16 similarly positioned across one of its edges. The flexible sheet 10 can be a "tail" integral with a printed circuit assembly, such as a membrane switch assembly, or can be a flat conduit for electronic signals directed between separate printed wiring boards.

The present connector clamp comprises an elongated member made of spring material. In the preferred embodiment, it is bent from a stainless steel sheet that is precut as shown in FIG. 7.

The formed clamp member has a continuous U-shaped cross-section along its length. This cross-section, illustrated in FIG. 6, includes a central base 17 joined integrally with first and second opposed legs 18 and 19. The legs 18 and 19 are yieldably urged toward one another along a line (indicated at 20) spaced from the central base 17 of the cross-sectional configuration. The two legs 18 and 19 are biased toward one another for exerting clamping force along the line 20 when clamped across opposite outer surfaces of the printed wiring board 14 and flexible sheet 10 as shown in FIGS. 1 and 8.

To assure that the designed clamping force of the elongated member is effectively exerted along the line 20, the interior separation across the central base 17 of the U-shaped cross-section is greater than the combined thicknesses of sheet 10 and board 14 (see FIG. 8).

One leg of the U-shaped cross-section, illustrated in the drawings as the first leg 18, includes a row of identical transverse fingers 21. Each finger 21 has a free end adapted to overlay the sheet 10 when installed. The fingers 21 are parallel to one another and are arranged perpendicular to the length of the elongated member on which they are formed. They are spaced along the elongated member to individually correspond to the positions of the conductive pads 12 and 16 along the respective sheet and board adapted to be secured by the clamp.

Figure 3:
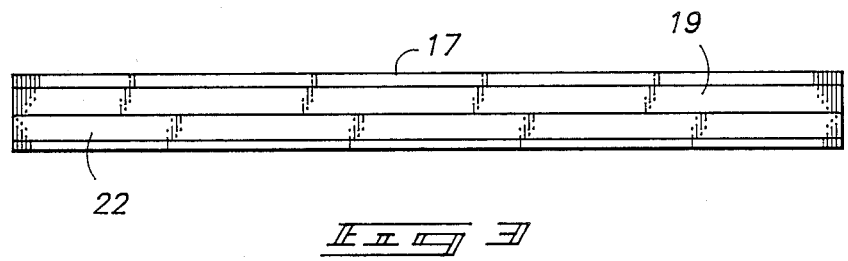
FIG. 3 is a rear plan view.

The remaining leg of the U-shaped cross-section, illustrated by the second leg 19, is uninterrupted and continuous throughout the length of the clamping member (see FIG. 3). Thus, the individual clamping force exerted at line 20 by each finger 21 is backed by the solid clamping element presented along the continuous leg 19 at the back of the printed wiring board 14.

The basic clamp arrangement just described provides a yieldable clamp that can be readily attached along the edge of a printed wiring board to hold a complementary conductive sheet in place with their respective conductive pads in direct engagement with one another. The spring member can be bent and designed to exert sufficient force along line 20 to assure effective electrical connections between the engaged pads 12 and 16.

While the basic clamp structure as described above can be forced transversely over the mating sheet 10 and printed wiring board 14, it is desirable to provide an arrangement for spreading the fingers 21 apart from the opposed continuous surface of leg 19 to facilitate application of the clamp to a sheet 10 and board 14. This is accomplished by providing extensions 22, 23 across both legs 18 and 19, respectively.

The extensions 22 and 23 are directed back toward the central base 17 at opposite sides of the U-shaped cross-section (see FIG. 6). Extensions 22, 23 are spaced outward from the respective legs 18 and 19 to form elongated openings along the full length of the clamp member for reception of tool elements designed to spread the legs 18, 19 apart from one another. These tool elements are generally illustrated at 24 in FIGS. 1 and 6. They are shown as rigid pivoted plates having a width spanning the full length of the spring member. They are freely received within the elongated openings between extensions 22, 23 and legs 18, 19, respectively. The pivot mounting of the tool elements 24 is not material to an understanding of the present invention. They are mounted so as to exert forces (indicated by arrows 26 in FIG. 6) which counteract the spring force of the elongated clamping member to selectively spread legs 18 and 19 apart.

To install the connector clamp, the tool elements 24 are inserted along its length, legs 18, 19 are momentarily spread as the clamping element is placed about the sheet 10 and board 14. The spreading force is released as the tool elements 24 are removed.

To further protect the free ends of fingers 21, particularly during insertion of tool elements 24, the leg 18 of the U-shaped cross-sectional configuration along the clamp member is completed by an elongated guard edge 25 aligned across and spaced from the outer ends of the fingers 21 (see FIG. 4). The continuous guard edge 25 facilitates formation of the fingers from the pattern shown in FIG. 7 by bending, and serves as a protective extension of the free fingers 21 in the installed connector clamp.

The specific bending details illustrated in the drawing are not intended to limit the cross-sectional configuration beyond the general discussion contained in this text. The form of the cross-sectional configuration is subject to alteration in order to allow the member to be set by bending to achieve a desired clamping force along the line 20.

Figure 9:
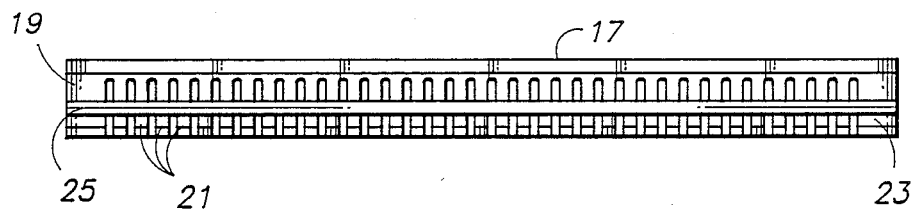
FIG. 9 is a plan view of a second form of the clamp.
Figure 10:
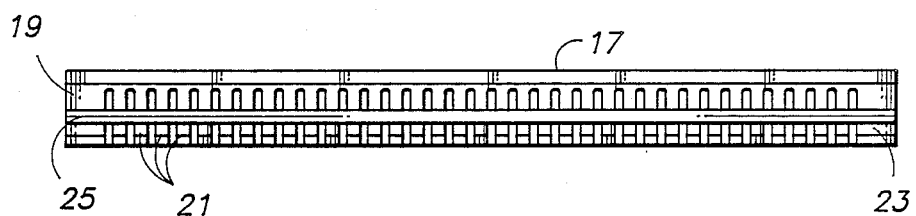
FIG. 10 is a rear plan view.
Figure 11:
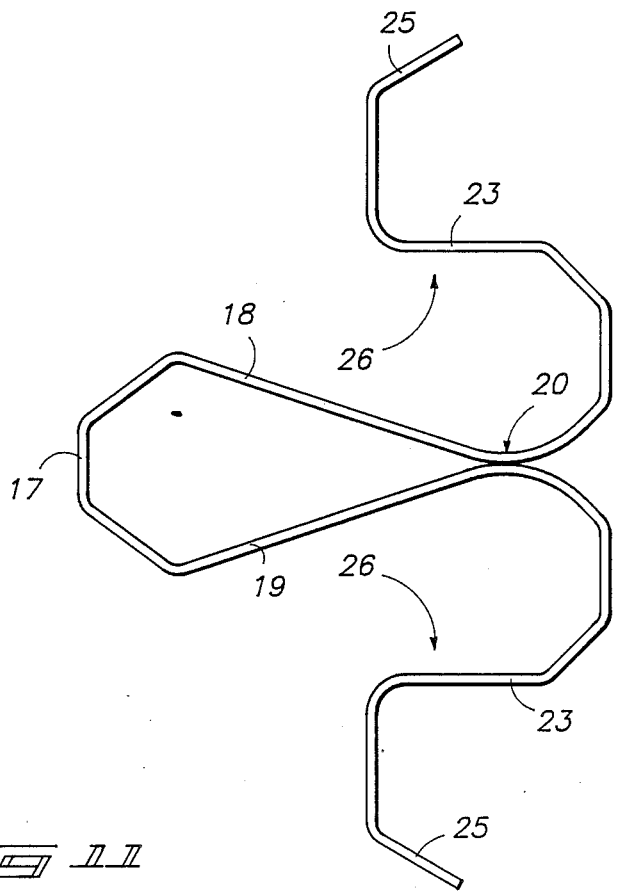
FIG. 11 is an enlarged sectional view taken along line 11—11 in FIG. 10.

FIGS. 9-11 show a two-sided version of the connector clamp which has fingers 21 on both sides, rather than one. It is usable in situations where the printed wiring board has conductive pads on opposed surfaces along one edge, and connection is required to separate flexible sheets having corresponding conductive pads. The reference numbers used in FIGS. 9-11 are identical with those used in conjunction with FIGS. 1-8 in regard to similar elements. The only change in structure involves duplication of fingers 21 and guard edge 25 along both sides of the elongated members.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

I claim:

1. A connector clamp for securing a flexible sheet with traces leading to conductive surface pads across one of its edges to a printed wiring board having traces leading to complementary conductive surface pads across one of its edges, comprising:

an elongated member made of spring material and having a continuous U-shaped cross-section along its length which includes a central base joined integrally with first and second opposed legs, the legs being yieldably urged toward one another along a line spaced from the base for exerting clamping force across opposite outer surfaces of a printed wiring board and flexible sheet having aligned rows of conductive surface pads in contact with one another;

the central base of the U-shaped cross-section having an interior separation greater than the combined thicknesses of the sheet and board to be secured by it; and one leg of the U-shaped cross-section in the elongated member being adapted to overlie the sheet and including a row of identical transverse fingers spaced apart from one another, the fingers each including a free end adapted to be aligned with the positions of corresponding conductive pads along a sheet and board;

the cross section of the spring clamp further including extensions of both legs directed back toward its base at opposite sides of the U-shaped cross-section and spaced outward from the respective legs to form elongated openings along the spring clamp for reception of tool elements designed to spread the legs of the spring clamp apart from one another.

2. The connector clamp of claim 1, wherein the fingers included in the one leg are extended into the outer extension associated with it.

3. The connector clamp of claim 2, wherein the one leg is completed by an elongated continuous guard aligned across and spaced from the outer ends of the fingers.

* * * * *